(12) United States Patent
Oshima

(10) Patent No.: US 6,879,620 B2
(45) Date of Patent: Apr. 12, 2005

(54) LASER BAR LOCKING APPARATUS

(75) Inventor: Noboru Oshima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/773,270

(22) Filed: Feb. 9, 2004

(65) Prior Publication Data

US 2004/0228382 A1 Nov. 18, 2004

Related U.S. Application Data

(62) Division of application No. 10/327,960, filed on Dec. 26, 2002, now Pat. No. 6,710,375.

(30) Foreign Application Priority Data

Dec. 27, 2001 (JP) .......................... 2001-397556

(51) Int. Cl.[7] ................................. H01S 3/08
(52) U.S. Cl. ........................ 372/107; 372/109
(58) Field of Search .................... 372/107, 109; 257/99, 98, 95, 72, 81

(56) References Cited

U.S. PATENT DOCUMENTS 4,748,482 A * 5/1988 Collins .................. 257/99

5,625,634 A   4/1997 Ukita et al.

FOREIGN PATENT DOCUMENTS

| JP | 62-104093  | 5/1987  |
| JP | 1-289289   | 11/1989 |
| JP | 1-318270   | 12/1989 |
| JP | 3-101183   | 4/1995  |
| JP | 9-162496   | 6/1997  |
| JP | 11-121876  | 4/1999  |
| JP | 11-284279  | 10/1999 |

* cited by examiner

*Primary Examiner*—David Nelms
*Assistant Examiner*—Thinh T Nguyen
(74) *Attorney, Agent, or Firm*—Morrison & Foerster LLP

(57) ABSTRACT

A semiconductor laser chip has an active layer, an allover electrode forming a lower face of the laser chip and a light emitting end surface of the laser chip. A Si thin film is formed on the light emitting end surface of the laser chip. An upper Si thin film is formed on an upper portion of the light emitting end surface and a lower Si thin film is formed on a lower portion thereof. The lower Si thin film is smaller in thickness than the upper Si thin film. Smaller thickness of the lower Si thin film prevents a component of the allover electrode from diffusing into the upper Si thin film that covers the active layer. Thus, decrease of a maximum optical output value is prevented, and reliability of the laser chips is increased.

3 Claims, 15 Drawing Sheets

Si FILM THICKNESS 10 Å

Si FILM THICKNESS 20 Å

Si FILM THICKNESS 30 Å

NO GOLD DIFFUSION INTO
LASER LIGHT EMITTING END SURFACE

GOLD DIFFUSION INTO LASER LIGHT EMITTING END SURFACE
DIFFUSION EXTENDED TO LIGHT EMITTING POINT

LASER BAR LOCKING APPARATUS

REFERENCE TO RELATED APPLICATIONS

This application is a division of Ser. No. 10/327,960, filed Dec. 26, 2002 now U.S. Pat. No. 6,710,375.

BACKGROUND OF THE INVENTION

The present invention relates to a semiconductor laser device, a manufacturing method thereof, and a laser bar locking apparatus.

As is in many cases of semiconductor laser devices, a GaAs laser chip 101 is provided with protective films 103, 104 having a same reflectance on light emitting end surfaces 101a, 101b of the GaAs laser chip 101, as shown in FIG. 10. The reference numeral 102 in FIG. 10 denotes an active layer of the GaAs laser chip 101. When the protective films 103, 104 have the same reflectance as stated above, both optical outputs from the light emitting end surface 101a and the light emitting end surface 101b are Po.

In the case where the protective films 103, 104 are structured from $Al_2O_3$ and given a refractive index of 1.60, when the. GaAs laser chip 101 is given a refractive index of 3.50, a reflectance of the protective films 103, 104 is changed by changing the film thickness thereof as shown in FIG. 11 (a laser emission wavelength $\lambda$=7800 Å).

Regardless of thickness of the protective films 103, 104, the protective films 103, 104 has a reflectance smaller than that of the GaAs laser chip 101. In the above case, when the optical film thickness of the protective films 103, 104 is odd multiples of $\lambda/4$, the reflectance of the protective films 103, 104 becomes the smallest. On the other hand, when the optical film thickness of the protective films 103, 104 is integral multiples of $\lambda/2$, the reflectance of the protective films 103, 104 becomes the largest and approximates most to the reflectance of the GaAs laser chip 101. This is because the refractive index of the protective films 103, 104 is smaller than the refractive index of the GaAs laser chip 101. It should be noted that the optical film thickness is defined as a film thickness multiplied by a reflectance.

In the case where the refractive index of the protective films. 103, 104 is larger than the refractive index of the GaAs laser chip 1, for example, where Si film is used as the protective film, the reflectance of the Si film becomes larger than that of the GaAs laser chip 101 regardless of the thickness of the Si film. In the above case, when the optical film thickness of the Si film is odd multiples of $\lambda/4$, the reflectance of the Si film becomes the largest. On the other hand, when the optical film thickness of the Si film is integral multiples of $\lambda/2$, the reflectance of the Si film becomes the smallest and approximates most to the reflectance of the GaAs laser chip 101.

In the case of a semiconductor laser device having a high output laser with an optical output of 20 mW or more for example, as shown in FIG. 12, there is provided a protective film 113 with a reflectance smaller than the reflectance of a laser chip 111 on a front-side light emitting end surface (main emitting face) 111a. Also, there is provided a protective film 114 with a reflectance larger than the reflectance of the laser chip 111 on a rear-side light emitting end surface 111b. Consequently, optical output Pf from the front-side light emitting end surface 111a of the laser chip 111 becomes higher than optical output Pr from the rear-side light emitting end surface 111b of the laser chip 111. For example, the protective film 113 on the light emitting end surface 111a is formed from $Al_2O_3$ so as to have a film thickness of approximately 700 to 1,600 Å, and the reflectance thereof is set to be approximately 15% or less. Here, a reference numeral 112 in FIG. 12 denotes an active layer of the laser chip 111.

Also, the protective film 114 on the light emitting end surface 111b; if composed of one layer, cannot attain a sufficiently high reflectance even if the refractive index thereof is larger than that of the laser chip 111. Therefore, the protective film 114 is composed of a plurality of layers. Specifically, the protective film 114 is composed of a first layer 114a to a fifth layer 114e. The first layer 114a and the third layer 114c are $Al_2O_3$ films with a thickness of $\lambda/4$ ($\lambda$: laser emission wavelength). The second layer 114b and the fourth layer 114d are amorphous Si films with a thickness of $\lambda/4$. The fifth layer 114e is an $Al_2O_3$ film with a thickness of $\lambda/2$. Thus, the protective film 114 attains a reflectance of approximately 85% or more.

Following description discusses a conventional manufacturing method of semiconductor laser devices.

First, in a semiconductor laser wafer 100 shown in FIG. 13, a cleavage line 117 is formed by scribe between an electrode 115 on a specified laser chip and an electrode 115 on a laser chip adjacent to the laser chip in direction orthogonal to a light emitting portion (channel) 118. Then, the semiconductor laser wafer 100 is cleaved. This provides a laser bar (a bar of laser chips) 121 from the semiconductor laser wafer 100 as shown in FIG. 14.

Next, the laser bars 121 are set into a laser bar locking apparatus 150 such that the electrode faces of the laser bars 121 are piled, as shown in FIG. 15. The laser bars 121 are also set into the laser bar locking apparatus 150 such that the front-side emitting faces of all the laser bars 121 and the rear-side emitting faces thereof face in the same direction, respectively.

Next, a protective film having a specified reflectance is formed on the light emitting end surface of the laser bar 121 which is locked in the laser bar locking apparatus 150. In this case, a vacuum depositor 170 is generally used as shown in FIG. 16. The vacuum depositor 170 is equipped with a vapor source 172, a rotating holder 173 for holding the above-described laser bar locking apparatus 150, and a crystal oscillator 174 disposed in the vicinity of the rotating holder 173 for monitoring deposition thickness of film, all of which are housed in a chamber 171.

Following description discusses a procedure of forming the protective film.

First, gas in the chamber 171 is exhausted through a duct 175 so as to put the chamber 171 in a vacuum. When a vacuum degree in the chamber 171 reaches a specified value, an deposition material 176 in the vapor source 172 is heated by an electron beam or the like for deposition. Thereby, the deposition material 176 is deposited on one light emitting end surface of the laser bar 121 to form a protective film.

After that, the rotating holder 173 is turned over by 180° rotation, and the deposition material 176 is again heated by an electron beam or the like for deposition. Thereby, the deposition material 176 is deposited on the other light emitting end surface of the laser bar 121 to form a protective film. A formation speed (deposition rate) of forming protective films on the both light emitting end surfaces of the laser bar 121 is so controlled as to be generally constant until completion of deposition. The deposition rate is controlled by a heating temperature, and therefore, the control in the electron beam deposition is performed by intensity of the electron beam. In the case of resistance heating, it is well known that control of the deposition rate is performed by controlling electric current applied to a resistive element. Specifically, when the deposition material is $Al_2O_3$, the deposition rate is generally set between several to 30 Å per sec. The deposition for the protective film is performed while film thickness of the protective film is monitored by the crystal oscillator 174. The deposition is terminated when the film thickness of the protective film reaches a specified film thickness.

In the case where a protective film is formed on an end surface of a laser chip by deposition, a partial pressure of oxygen molecules rises immediately after start of deposition, the oxygen molecules being generated from oxide ($Al_2O_3$) as a material for the protective film. There is a high possibility that a damage is caused on the end surface of the laser chip since the oxygen molecules collide with or bond to the end surface of the laser chip. Also, the damage is further increased if an active layer of the laser chip or an adjacent layer of the active layer is made of any compositions including aluminum. Therefore, a reliability has not been ensured when the semiconductor laser device manufactured according to the above-stated is so operated as to obtain a high output.

For a solution of such a problem as the above, a laser chip 111 as shown in FIG. 17 has been proposed. A Si thin film 123 of about 20 Å in thickness is deposited on a front-side light emitting end surface 111a of the laser chip 111, and thereafter the protective film 133 is formed on the Si thin film 123. In this case, the Si thin film 123 is first formed, decomposition of which does not generate oxygen during deposition. Therefore, in the state of low partial pressure of oxygen, film formation in the vicinity of the end surface of the laser chip 111 may be performed since immediately after start of deposition. As a result, the above-described damage on the vicinity of the end surface can be advantageously restrained and reliability in high output operation is fully ensured.

The semiconductor laser device of FIG. 17 is provided with gold electrodes 115, 116 on the upper face and the lower face of the laser chip 111 as shown in FIGS. 18A and 18B.

The gold electrode 115 on the upper face of the laser chip 111 is formed to have such a pattern that the width on the side of the light emitting end surface 111a is smaller than the width on the side of the light emitting end surface 111b. This pattern is for distinguishing the front-side light emitting end surface 111a of the laser chip 111 from the rear-side light emitting end surface 111b of the laser chip 111. The gold electrode 115 is formed to be smaller than the upper face of the laser chip 111, and the peripheral edge of the gold electrode 115 is not overlapped with the peripheral edge of the upper face of the laser chip 111.

The surface of the gold electrode 116 on the lower face of the laser chip 111 becomes a die bond face to cover the entire lower face of the laser chip 111. In other words, the gold electrode 116 is a so-called allover gold electrode. In this case, since the gold electrode 116 is the allover electrode, the gold electrode 116 and the Si thin film 123 come into contact at a point A as shown in FIG. 18B. As a result, as shown in FIGS. 19A to 19C, gold in the gold electrode 116 may diffuse toward the Si thin film 123 due to heating in deposition of Si. Diffusion areas 119, 120 of gold are shown in FIGS. 19B and 19C, respectively.

When the thickness of the Si thin film 123 is around 40 Å, in most cases, the gold diffusion area 120 extends to a light emitting point 124 as shown in FIG. 19C. Also, even when the thickness of the Si thin film 123 is around 20 Å as shown in FIG. 19C, the gold diffusion area 119 may extend to the light emitting point 124.

When the gold diffusion areas 119, 120 extend to the light emitting point 124 as described above, a maximum optical output value (so-called COD (Catastrophic Optical Damage) level) becomes about half of that or lower in the case of no gold diffusion. This causes a problem of considerably degraded reliability of the laser chip 111 as shown in FIGS. 20A and 20B.

As a solution of this problem, gold in the peripheral part of the gold electrode 116 is removed, so that the gold electrode 116 does not come into contact with the Si thin film 123 like the gold electrode 115 on the upper face of the laser chip 111. However, operations for removing gold in the peripheral part of the gold electrode 116 are complex to require time and cost.

SUMMARY OF THE INVENTION

An object of the present invention is to provide a semiconductor laser device, a manufacturing method thereof, and a laser bar locking apparatus, capable of preventing decrease in a maximum optical output value and increasing reliability of semiconductor laser chips.

The present invention provides a semiconductor laser device comprising:

a semiconductor laser chip having an active layer and an allover electrode, the allover electrode forming a lower face of the semiconductor laser chip;

a Si thin film formed on a light emitting end surface of the semiconductor laser chip;

a protective film having a specified reflectance and formed on the Si thin film, wherein the Si thin film is comprised of an upper Si thin film formed on an upper portion of the light emitting end surface and a lower Si thin film formed on a lower portion of the light emitting end surface, the upper Si thin film covers an end of the active layer and the lower Si thin film covers an end of the allover electrode, and the lower Si thin film is smaller in thickness than the upper Si thin film.

According to the above configured semiconductor laser device, the film thickness of the lower Si thin film formed on the lower portion of the light emitting end surface in the semiconductor laser chip is smaller than the upper Si thin film formed on the upper portion of the light emitting end surface in the semiconductor laser chip.

Therefore, the small film thickness of the lower Si thin film restrains a constituent element of the allover electrode from diffusing toward the upper Si thin film which covers the active layer. In other words, the constituent element of the allover electrode does not diffuse into the upper Si thin film covering the active layer when the lower Si thin film is small in thickness. Therefore, no extreme decrease of the maximum optical output value occurs and therefore reliability of the semiconductor laser device is increased.

In one embodiment of the present invention, the lower Si thin film is 10 Å or less in thickness.

In one embodiment of the present invention, the Si thin film is formed only by the upper Si thin film, and the protective film is formed in an interception area of the lower Si thin film on the lower portion of the light emitting end surface.

According to the above configured semiconductor laser device, only the upper Si thin film is formed on the upper light emitting end surface of the semiconductor laser chip, but the lower Si thin film is not formed on the lower light emitting end surface of the semiconductor laser chip. In the interception area of the lower Si thin film on the lower portion of the light emitting end surface, the protective film is formed.

Therefore, a constituent element of the allover electrode does not diffuse toward the upper Si thin film covering the active layer. Therefore, no extreme decrease of the maximum optical output value occurs and therefore reliability of the semiconductor laser device is increased.

In one embodiment of the present invention, the interception area is connected to the lower face of the semiconductor laser chip.

In one embodiment of the present invention, the allover electrode is made of gold.

The present invention also provides a manufacturing method of a semiconductor laser device including:

a semiconductor laser chip having an active layer and an allover electrode, the allover electrode forming a lower face of the semiconductor laser chip;

a Si thin film formed on a light emitting end surface of the semiconductor laser chip;

a protective film having a specified reflectance and formed on the Si thin film, wherein the Si thin film is comprised of an upper Si thin film formed on an upper portion of the light emitting end surface and a lower Si thin film formed on a lower portion of the light emitting end surface, the upper Si thin film covers an end of the active layer and the lower Si thin film covers an end of the allover electrode, the lower Si thin film is smaller in thickness than the upper Si thin film, the manufacturing method of the semiconductor laser device comprising the step of shielding the lower portion of the light emitting end surface by using a shielding member when the Si thin film is formed.

The present invention also provides a laser bar locking apparatus for locking a laser bar, the laser bar having an active layer of laser chips and an allover electrode forming a lower face of the laser chips, the laser bar locking apparatus comprising:

a flat portion for mounting the laser bar thereon by contacting the allover electrode with the flat portion; and a shielding portion provided on a side of the flat portion in such a manner that the shielding portion is located lower than a position of the active layer so as to shield a lower portion of a light emitting end surface of the laser chips in the laser bar.

In one embodiment of the present invention, the flat portion is provided with a vacuum suction hole for locking the laser bar by sucking air in the vacuum suction hole.

In one embodiment of the present invention, a width of the flat portion is a length obtained by adding approximately 50 µm to 80 µm to a length of a resonator of the laser chip.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A is a perspective view showing a laser bar locking apparatus in an embodiment 1 of the present invention, while

FIG. 18A is a perspective view showing the semiconductor laser device of FIG. 17, while

DETAILED DESCRIPTION OF THE PREFERRED EMBODIMENTS

Description is hereinbelow given of a manufacturing method of the semiconductor laser device in embodiments of the present invention.

Embodiment 1

Upon describing an embodiment 1 of the present invention, drawings used in the background of the invention are employed.

Figure 1A:
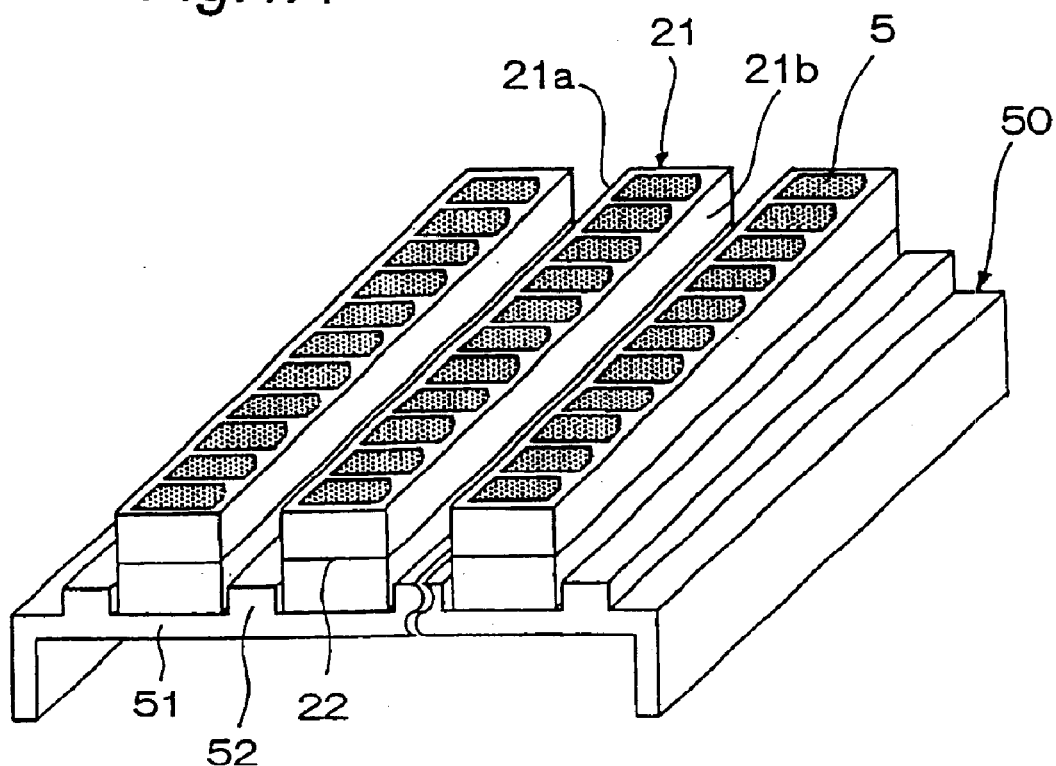
Figure 1B:
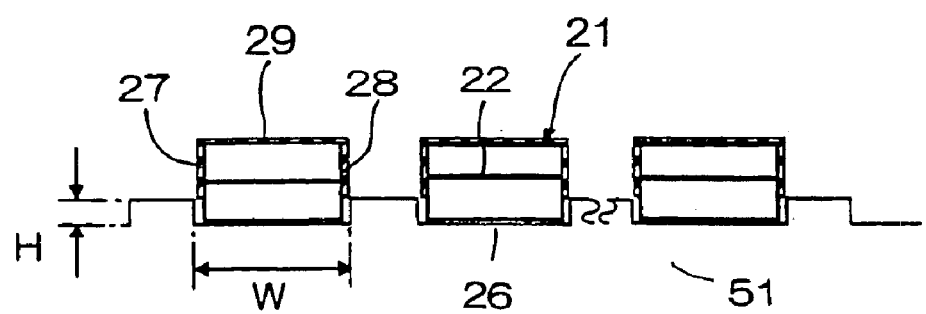
FIG. 1B is a schematic cross sectional view showing the laser bar locking apparatus.

First, as shown in FIG. 1A, a laser bar 21 obtained from a laser wafer by cleaving is mounted on a flat portion 51 of a laser bar locking apparatus 50. At this point, the laser bar 21 is mounted on the flat portion 51 such that a gold electrode 5 provided on the upper face of the laser bar 21 is upward. Consequently, an allover electrode 26 made of gold provided on the lower face of the laser bar 21 (see FIG. 3A) is brought into contact with the flat portion 51. On the both sides of the flat portion 51, there are provided a plurality of shielding walls 52 as shielding members. Also as shown in FIG. 1B, the height H of the shielding wall 52 is designed to be lower than the height of a light emitting layer 22 of the laser bar 21. The active layer 22 is made of GaAlAs. That is to say, the composition of the active layer 22 contains aluminum.

Figure 2:
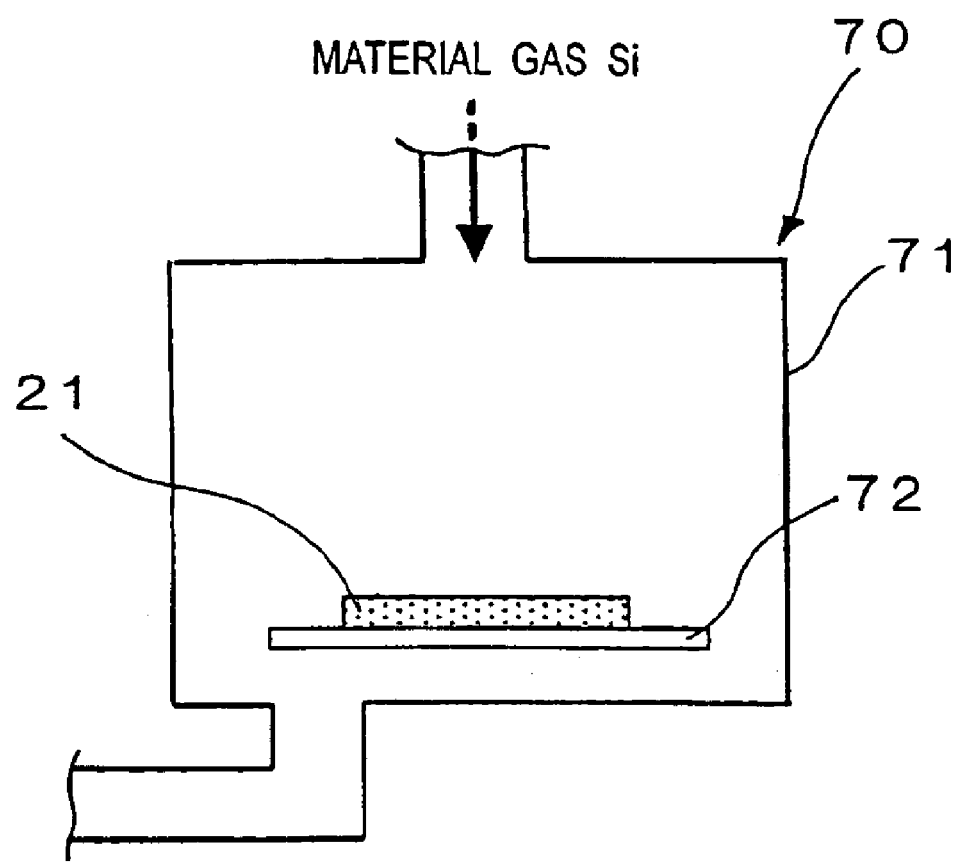
FIG. 2 is a schematic cross sectional view showing a CVD film forming apparatus.

Next, as shown in FIG. 2, the laser bar locking apparatus 50 on which the laser bar 21 is set is mounted on a film forming stage 72 inside a film forming chamber 71 of a CVD film forming apparatus 70.

Figure 3A:
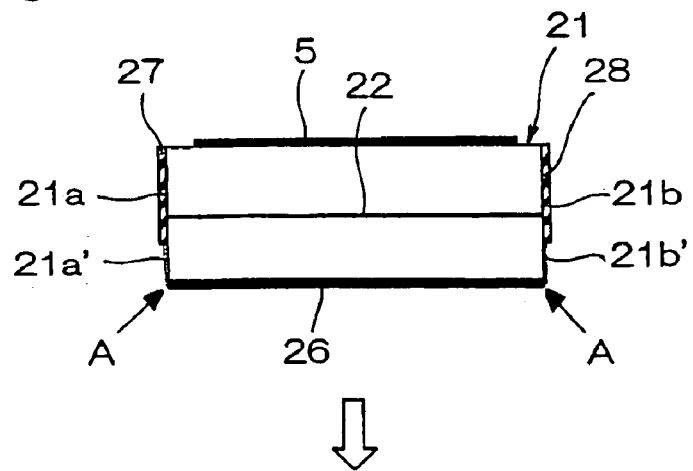
FIGS. 3A to 3C are process charts showing a manufacturing method of a semiconductor laser device in the embodiment 1 of the present invention.
Figure 3B:
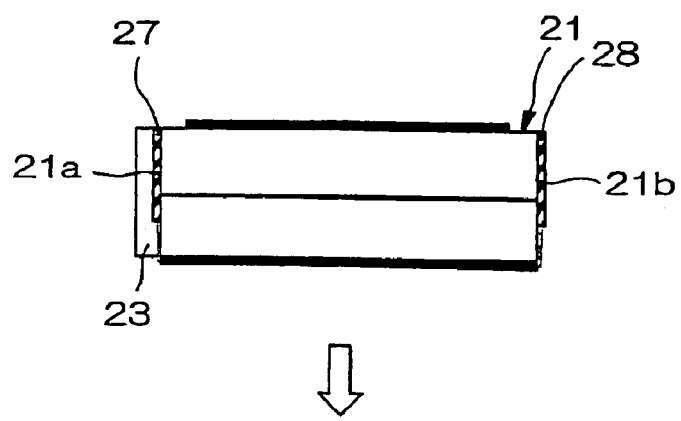
Figure 3C:
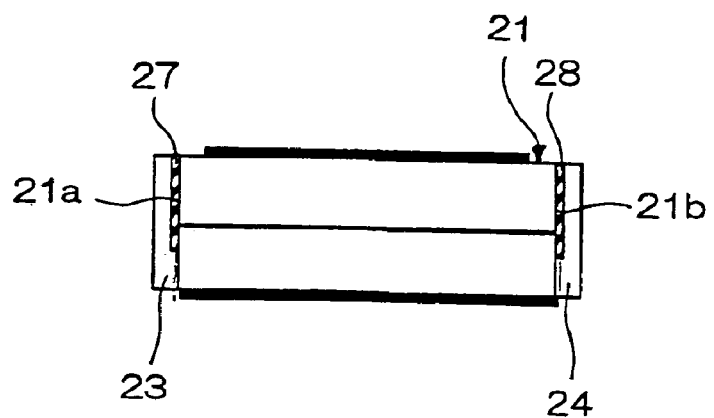

Next, on light emitting end surfaces 21a, 21b of the laser bar 21, there are sequentially formed Si thin films 27, 28 and protective films 23, 24 as shown in FIGS. 3A to 3C.

Hereinbelow, formation of the Si thin films 27, 28 is described in detail.

As shown in FIG. 3A, firstly, Si thin films 27, 28 are deposited on the light emitting end surfaces 21a, 21b of the laser bar 21 at a film formation rate of 1 Å/sec or less by using the CVD apparatus 70 shown in FIG. 2 so that film thicknesses of the Si thin films 27, 28 become approximately 20 Å. During deposition, lower portions 21a', 21b' of the light emitting end surfaces 21a, 21b are shielded by the shielding wall 52 of the laser bar locking apparatus 50. Therefore, the Si thin film is less formed on the lower portions 21a', 21b'. Consequently, thickness of the Si thin films 27, 28 on the lower portions 21a', 21b' becomes around 10 Å or less. On the other hand, the film thickness of the Si thin films 27, 28 on upper portions of the light emitting end surfaces 21a, 21b is approximately 20 Å, as stated above.

Thus, the Si thin films 27, 28 are deposited by CVD method, and therefore, the Si thin films 27, 28 are formed in the state of relatively low partial pressure of oxygen. This prevents deterioration due to oxidation on the light emitting end surfaces 21a, 21b.

The Si thin films 27, 28 and the allover electrode 26 come into contact with each other at the point A, as shown in FIG. 3A. However, the film thickness of the Si thin films 27, 28 on the lower portions 21a', 21b' is around 10 Å or less and thinner than that (approximately 20 Å) on the upper portions. In the Si thin films 27, 28 of 10 Å thickness on the lower portions 21a', 21b', therefore, heating during deposition of Si does not cause diffusion of gold of the allover electrode 26 into the Si thin films 27, 28. As a result, the gold of the allover electrode 26 may be prevented from diffusing into the Si thin films 27, 28.

When the Si thin films 27, 28 are formed, a Si thin film 29 is also formed, as not shown in FIGS. 3A to 3C but shown in FIG. 1B. However, the Si thin film 29 to be formed on a gold electrode 5 is an unnecessary film that should be removed. After completion of all the film forming, the Si thin film 29 is removed, and removing method of the Si thin film 29 will be described later.

After the Si thin films 27, 28 is completely formed, all the protective films are formed by the vacuum deposition method.

First, a laser bar locking apparatus 50 shown in FIG. 1 is put out from the CVD apparatus 70 shown in FIG. 2, and the laser bar 21 is detached from the laser bar locking apparatus 50.

Figure 15:
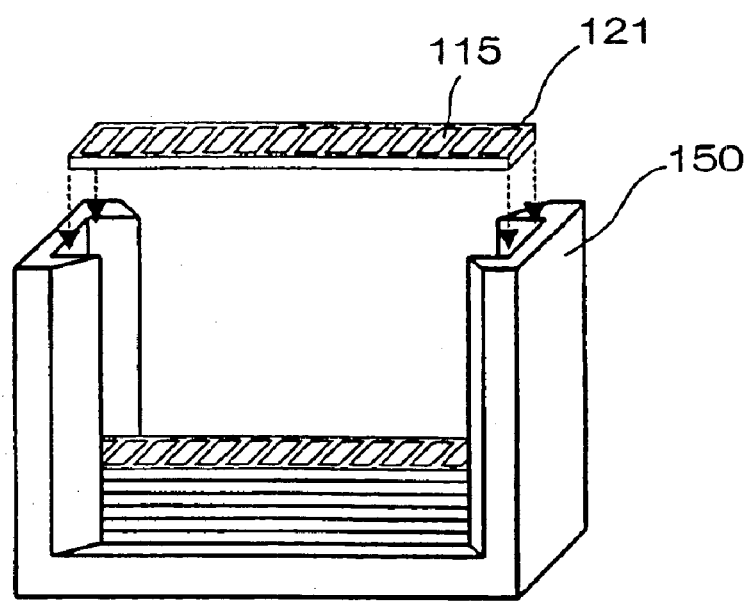
FIG. 15 is a perspective view showing a conventional laser bar locking apparatus.

After that, a plurality of laser bars 21 are set into the conventional laser bar locking apparatus 150 shown in FIG. 15 so that electrode faces of the laser bars 21 are piled. At this point, all the laser bars 21 are set in the laser bar locking apparatus 150 such that the front-side light emitting end surfaces (main light emitting face) 21a face in the same direction.

Figure 16:
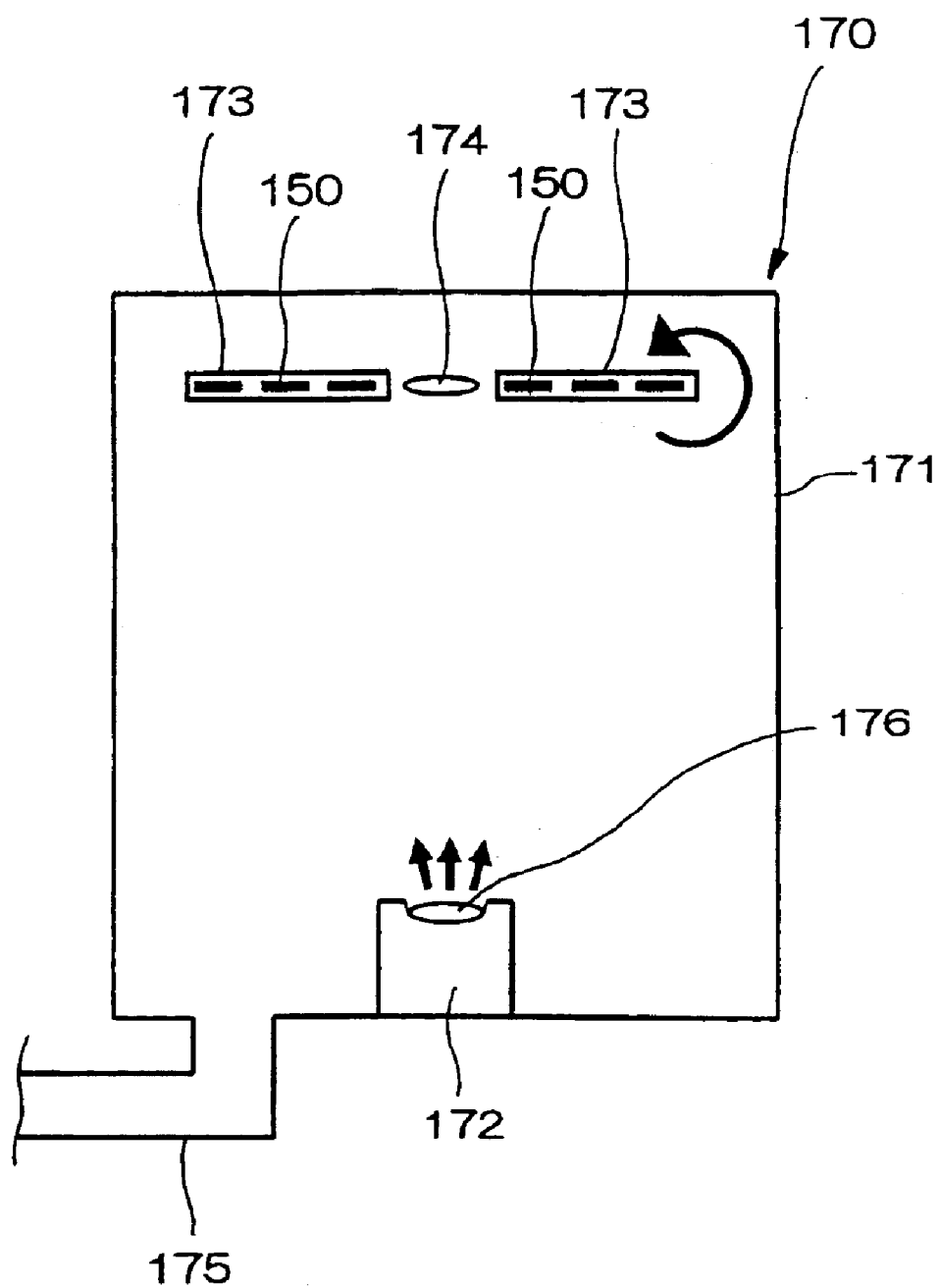
FIG. 16 is a schematic cross sectional view showing a vacuum depositor.
Figure 17:
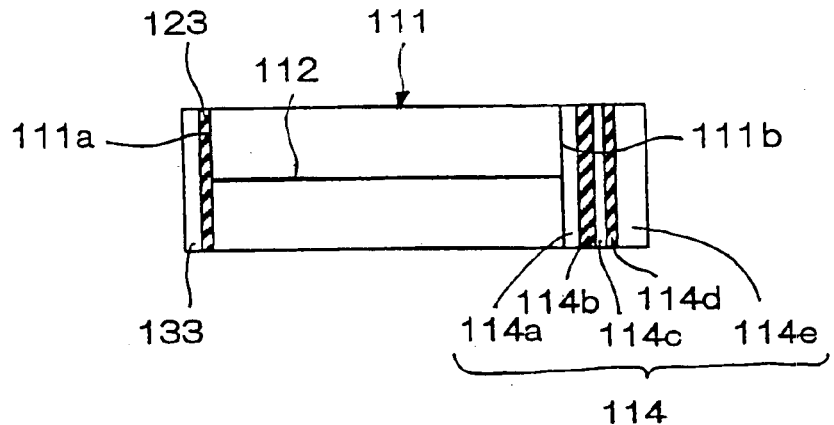
FIG. 17 is a view showing a modified example of the semiconductor laser device of FIG. 12.
Figure 18A:
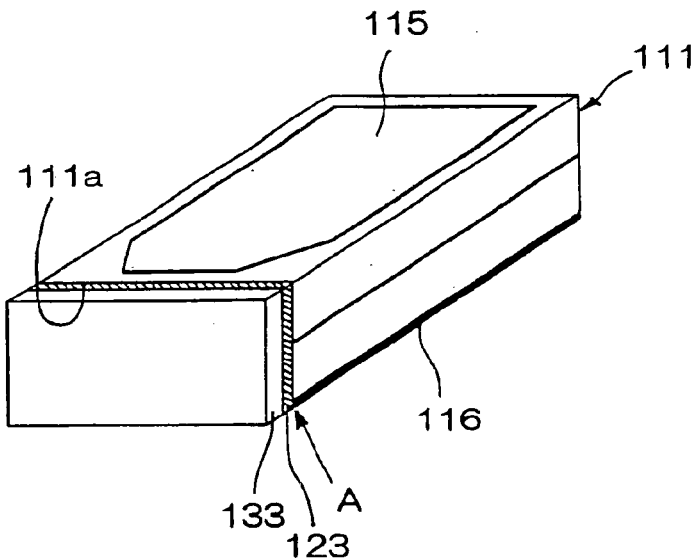
Figure 18B:
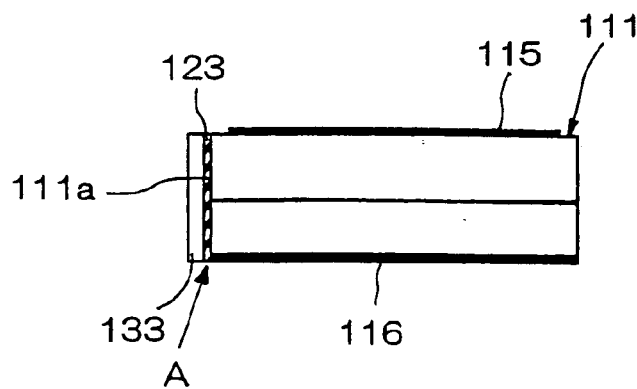
FIG. 18B is a schematic cross sectional view showing the semiconductor laser device.

Next, by using the vacuum depositor 170 shown in FIG. 16, a protective film having a specified reflectance is formed on the light emitting end surfaces 21a, 21b of the laser bars 21 which are locked in the conventional laser bar locking apparatus 150 shown in FIG. 15. At a first stage, the conventional laser bar locking apparatus 150 is set onto the rotating holder 173 inside the chamber 171 so that the light emitting end surface 21a of the laser bar 21 faces the vapor source 172.

Then, the gas inside the chamber 171 is exhausted via the duct 175. When inside of the chamber 171 attains a specified degree of vacuum, an deposition material 176 is evaporated from the vapor source 172. As a result, protective films 23, 24 are formed as shown in FIGS. 3B and 3C.

Hereinbelow, detailed description is given of formation of the protective films 23, 24.

As shown in FIG. 3B, the protective film 23 is formed on the Si thin film 27 in front of the laser bar 21 so as to have a specified film thickness. In the case of the protective film 23 made of $Al_2O_3$, in other words, in the case where the deposition material 176 is $Al_2O_3$, the film forming rate of around 30 Å/sec or less is appropriate.

During formation of the protective film 23, oxygen is generated by decomposition of the deposition material 176, which rises partial pressure of oxygen. However, as described before, the Si thin film 27 is already formed on the light emitting end surface 21a, so that oxygen does not directly collide with or bond to the laser light emitting end surface 21a.

Next, after complete formation of the protective film 23 on the front side of the laser bar 21, the rotating holder 173 shown in FIG. 16 is turned over by 180° rotation so that the light emitting end surface 21b faces the vapor source 172. Then, as shown in FIG. 3C, the protective film 24 is formed so as to have a specified film thickness on the light emitting end surface 21b on the rear side of the laser bar 21. The method of forming the protective film 24 is substantially identical to the above-described method of forming the protective film 23.

Figure 11:
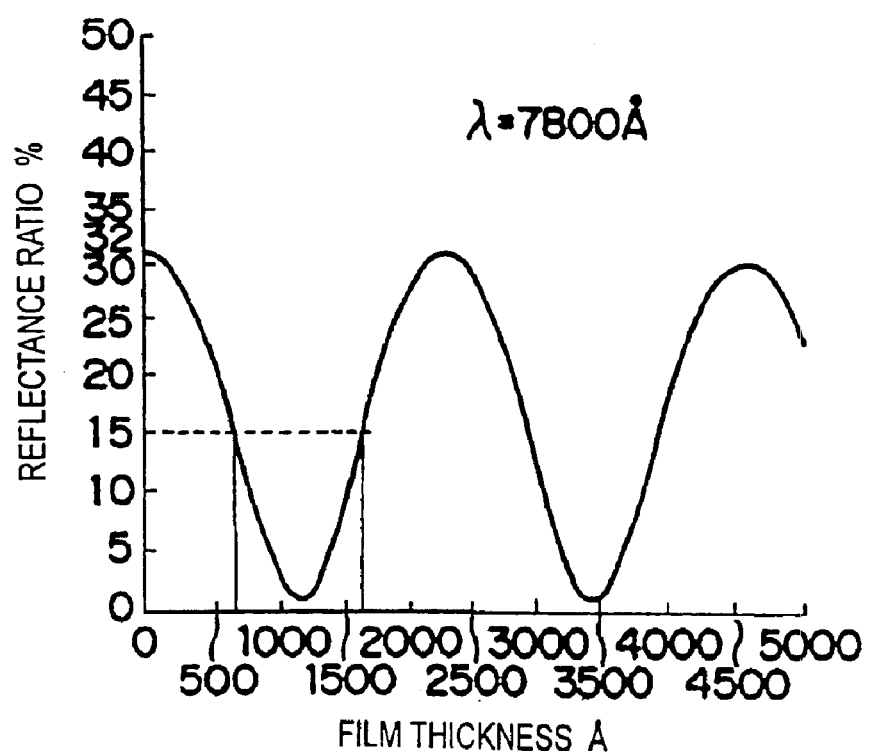
FIG. 11 is a graph showing relationship between a reflectance of a protective film and a film thickness of the protective film.
Figure 12:
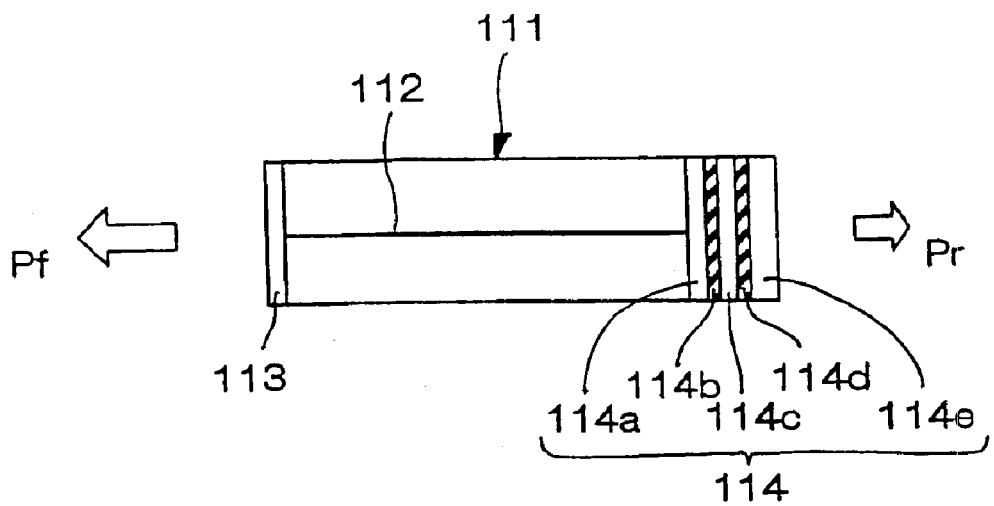
FIG. 12 is a schematic cross sectional view showing another conventional semiconductor laser device.
Figure 13:
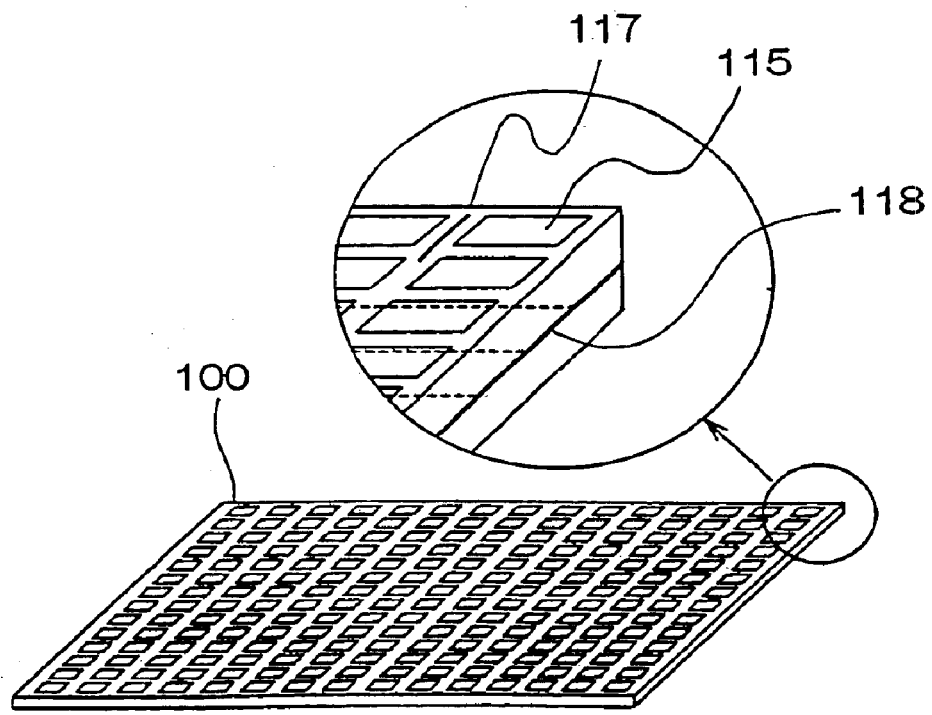
FIG. 13 is a perspective view showing a semiconductor laser wafer.
Figure 14:
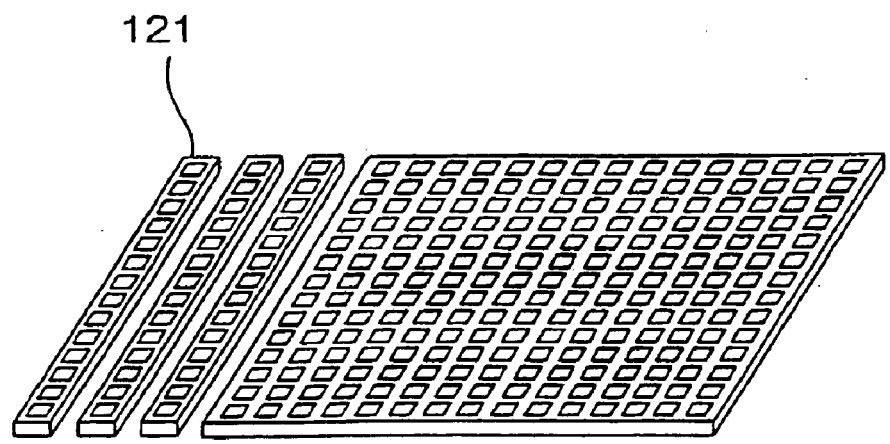
FIG. 14 is a perspective view showing the semiconductor laser wafer of FIG. 13 after divided.

It is noted that the Si thin films 27, 28 are interposed between the laser bar 21 and the protective films 23, 24, respectively. The protective films 23, 24 may cause change in characteristic of the reflectance shown in FIG. 11. However, its change is negligible because thickness of the Si thin films 27, 28 is approximately 20 Å and therefore sufficiently small. In addition, even if the characteristic of reflectance is changed, it is possible to obtain a desired reflectance by properly adjusting the thickness of the protective films 23, 24.

The Si thin film 29 shown in FIG. 1B is an unnecessary film and removed after the protective film 23 is formed on the Si thin films 27, 28 as briefly described above.

Specifically, for removing the Si thin film 29, first, after formation of all the protective films 27, 28 are completed, all the laser bars 21 (121 in FIG. 15) are detached from the conventional laser bar locking apparatus 150 shown in FIG. 15.

Figure 4A:
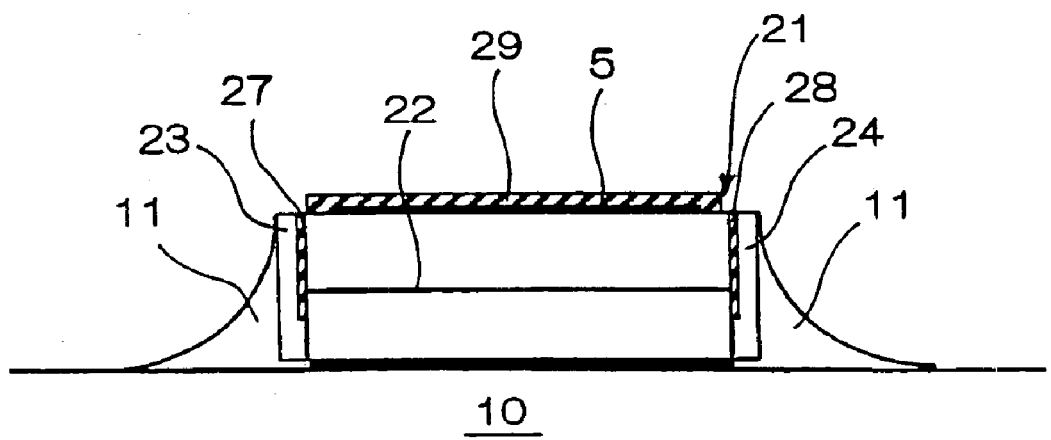
FIGS. 4A and 4B are explanatory views showing a method of removing an unnecessary Si thin film.

Next, as shown in FIG. 4A, an end surface protection material 11 such as resist or wax is slightly applied onto a substrate 10 made of glass, Si or the like. Thereafter, the laser bar 21 is placed on the end surface protection material 11. Then, the end surface protection material 11 naturally climbs up on the surface of the protective film 23, 24, so that the protective films 23, 24 are protected by the end surface protection material 11.

Figure 4B:
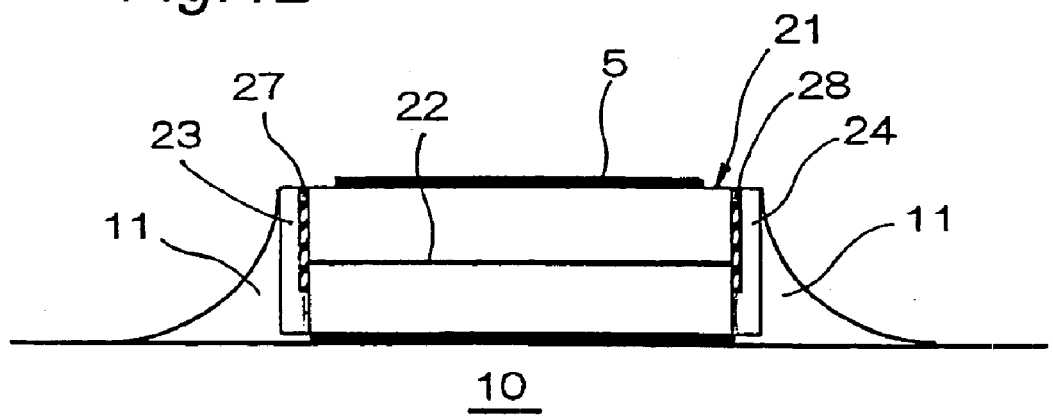

Next, after hardening the end surface protection material 11, the unnecessary Si thin film 29 on the gold electrode 5 is removed as shown in FIG. 4B by a wet etching method or the like.

Finally, the end surface protection material 11 is removed, and the laser bar 21 is detached from the substrate 10.

Thus, a plurality of the semiconductor laser devices of the present embodiment 1 are obtained by dividing the laser bars 21 which are so formed as to have the Si thin films 27, 28 and the protective films 23, 24 as described above.

Figure 5:
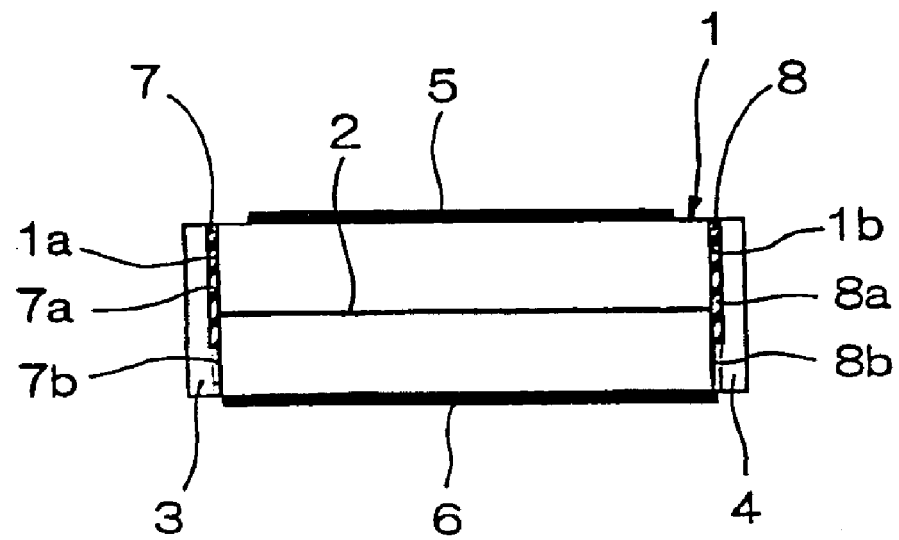
FIG. 5 is a schematic cross sectional view showing the semiconductor laser device in the embodiment 1 of the present invention.

FIG. 5 is a schematic cross sectional view showing a semiconductor laser device which is made in the same way as the above stated.

The semiconductor laser device is constituted of a semiconductor laser chip 1, Si thin films 7, 8 formed on light emitting end surfaces 1a, 1b of the semiconductor laser chip 1, and protective films 3, 4 having a specified reflectance and formed on the Si thin films 7, 8.

The semiconductor laser chip 1 has an active layer 2 made of GaAlAs. Also, a gold electrode 5 patterned to a specified shape is provided on the upper face of the semiconductor laser chip 1. An allover electrode 6 made of gold is provided on the lower face of the semiconductor laser chip 1.

The Si thin films 7, 8 located on upper portions of the light emitting end surfaces 1a, 1b and covering an end of the active layer 2 are defined as first Si thin films 7a, 8a, respectively. Also, the Si thin films 7, 8 located on lower portions of the light emitting end surfaces 1a, 1b are defined as second Si thin films 7b, 8b, respectively. The second Si thin films 7b, 8b are formed to be thinner than the first Si thin films 7a, 8a, respectively.

Specifically, for example, film thickness of the first Si thin films 7a, 8a is approximately 20 Å, and film thickness of the second Si thin films 7b, 8b is around 10 Å or less.

Figure 19A:
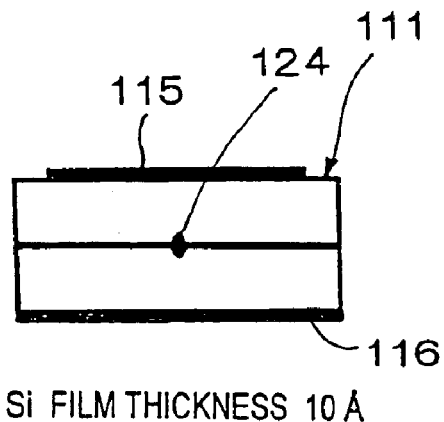
FIGS. 19A to 19C are explanatory views showing diffusion of gold caused by heating during deposition.
Figure 19B:
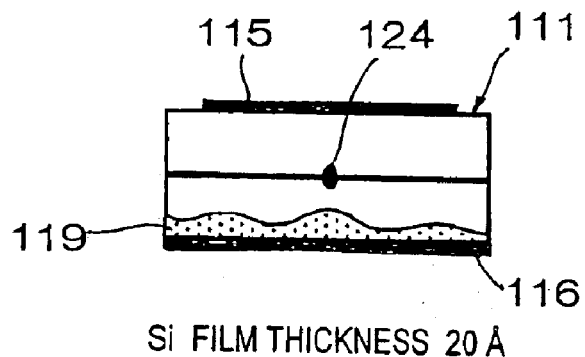
Figure 19C:
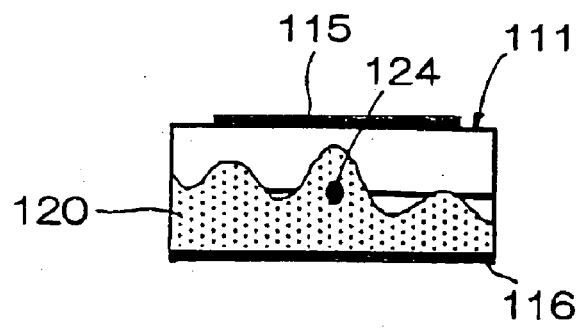
Figure 20A:
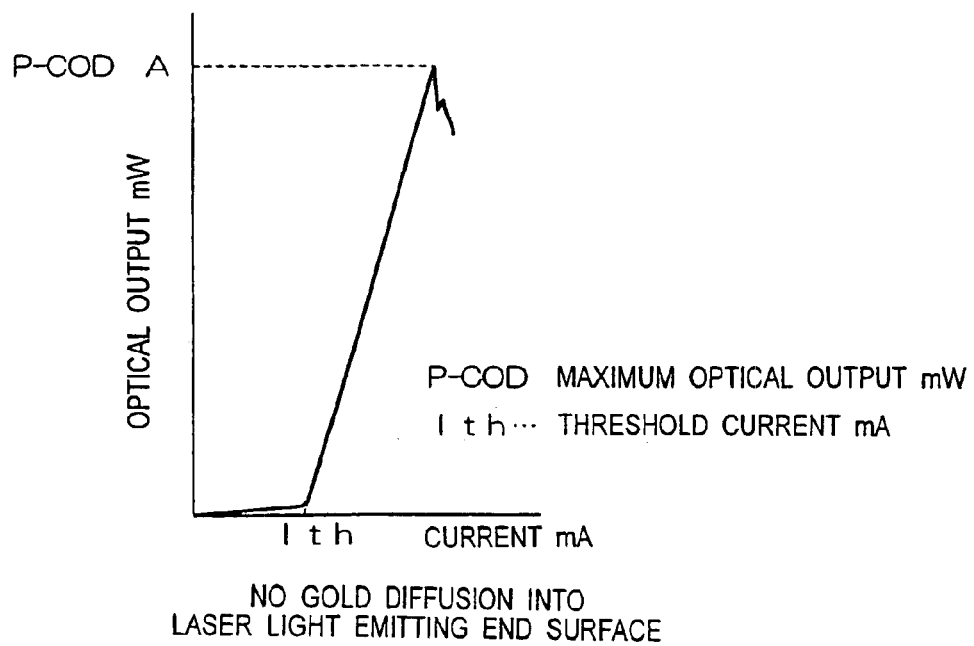
FIGS. 20A and 20B are graphs showing a maximum optical output value.
Figure 20B:
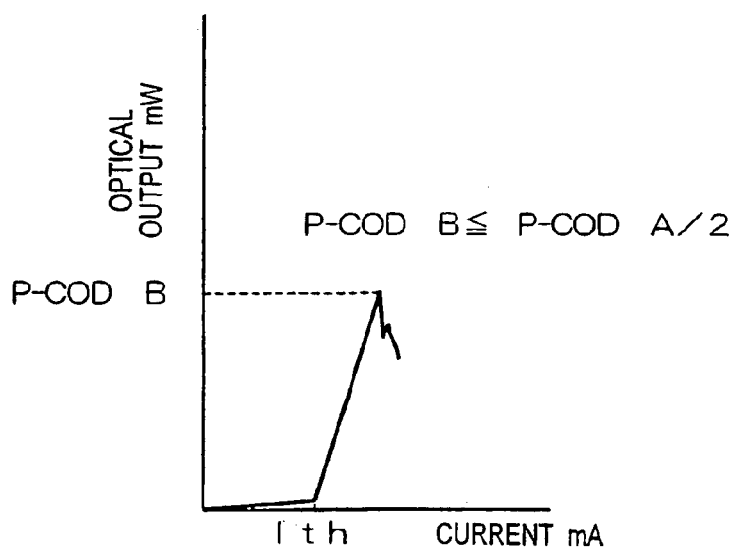

In this semiconductor laser device, gold does not diffuse into the Si thin films 7, 8 as described above with reference to FIG. 19A. This prevents the maximum optical output value from extremely decreasing, and thereby ensures high reliability of the semiconductor laser chip 1.

Figure 6:
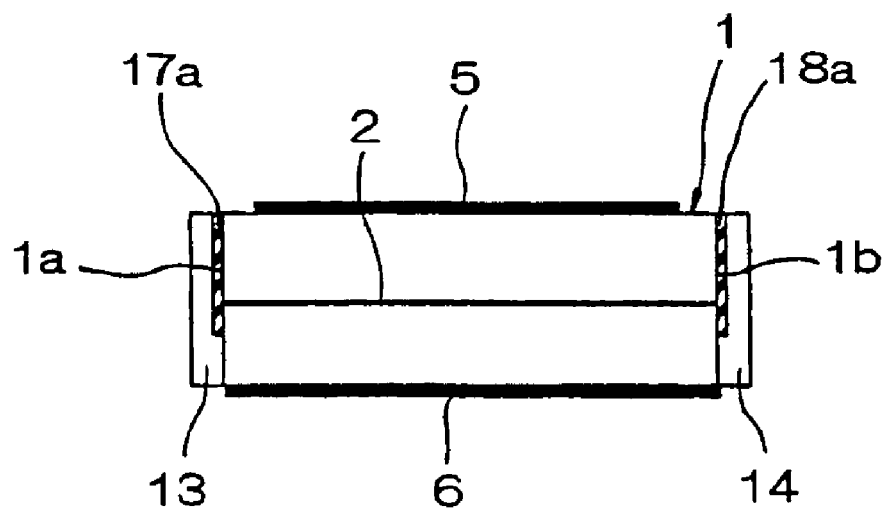
FIG. 6 is schematic cross sectional view showing a modified example of the semiconductor laser device in the embodiment 1 of the present invention.

In the embodiment 1 of the present invention, the second Si thin films 7b, 8b are formed on the lower portions of the light emitting end surfaces 1a, 1b. However, the second Si thin films 7b, 8b are not necessarily indispensable. In other words, as shown in FIG. 6, only the first Si thin films 7a, 8a may be provided without the second Si thin films 7b, 8b. In this case, the semiconductor laser device of FIG. 6 is also free from extreme decrease of the maximum optical output value. Therefore, high reliability of the semiconductor laser chip 1 is also obtained.

Embodiment 2

A semiconductor laser device according to an embodiment 2 is identical to the semiconductor laser device of the embodiment 1 except that the reflectances of the both end portions are different from each other. In other words, the semiconductor laser device of the embodiment 2 has two end portions which are asymmetric to be different in reflectance. Such a semiconductor laser device is .usually used for high output lasers, and typically has a single-layered film of low reflection and a multilayered film of high reflection.

For example, in the case of a high output laser having an optical output of approximately 20 W or more, so as to increase the optical output from a main emitting face of the laser, a side of the main emitting face is designed to have low reflection while the opposite side to the main emitting face is designed to have high reflection. In the case that $Al_2O_3$ and Si are used as protective film materials, a protective film on the main emitting face is generally formed by a single-layered film of $Al_2O_3$ so as to have a low reflectance of approximately 15% or less. More particularly, if a refractive index of the $Al_2O_3$ film is 1.60, a refractive index of the laser chip is 3.50, and an emission wavelength is $\lambda$=7,800 Å, then FIG. 11 can be applied and shows that the film thickness of a protective film corresponding to the reflectance of approximately 15% or less is equal to approximately 700 Å to 1,600 Å.

Figure 7A:
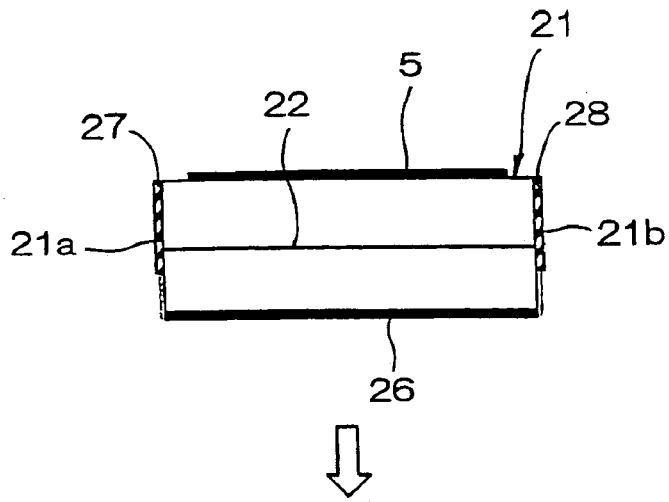
FIGS. 7A to 7C are process charts showing a manufacturing method of a semiconductor laser device in an embodiment 2 of the present invention.
Figure 7B:
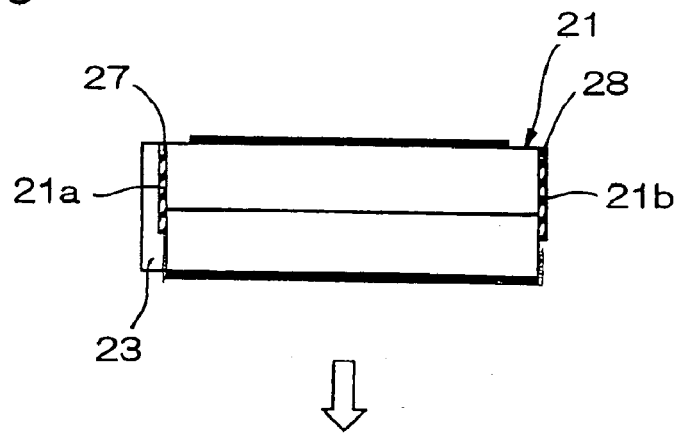
Figure 7C:
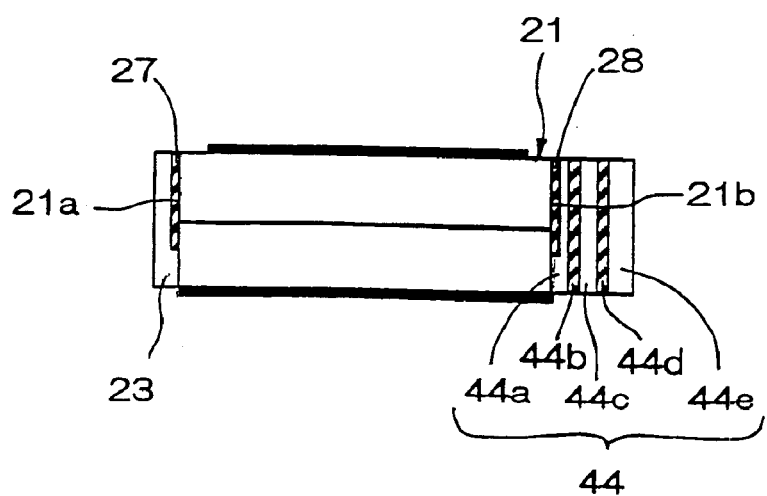
Figure 8:
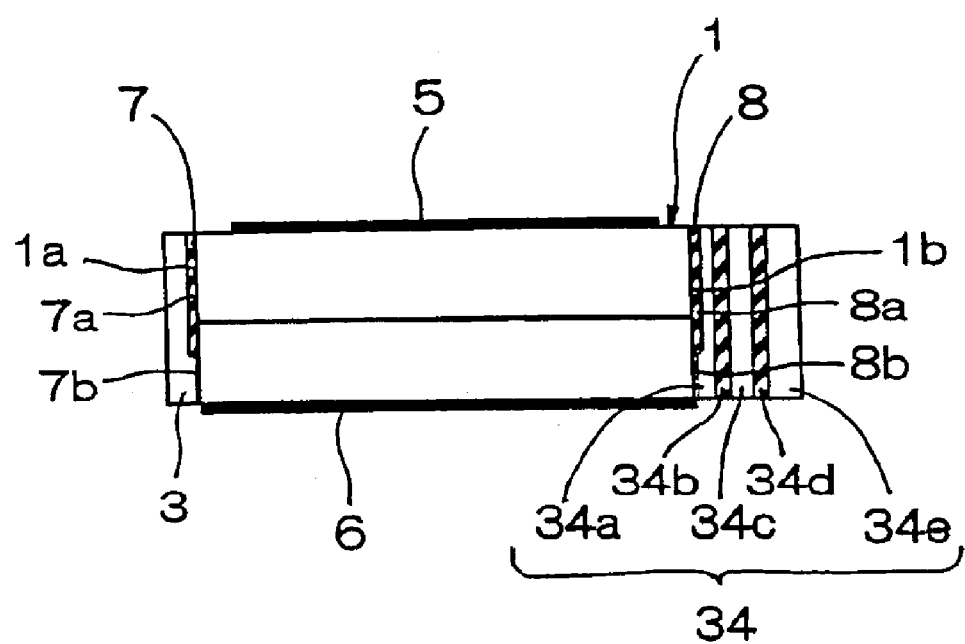
FIG. 8 is a schematic cross sectional view showing the semiconductor laser device in the embodiment 2 of the present invention.

FIGS. 7A to 7C are process charts showing a manufacturing method of the semiconductor laser device according to the embodiment 2 of the present invention. FIG. 8 is a schematic cross sectional view showing the semiconductor laser device.

In FIGS. 7A to 7C and FIG. 8, component members identical to the component members shown in FIGS. 3A to 3C and FIG. 5 are designated by reference numerals identical to those of FIGS. 3A to 3C and FIG. 5. Description thereof will be omitted or simplified.

In FIGS. 7A to 7C, a method of forming a Si thin film 27 and a protective film 23 on the main emitting face is totally identical to the method thereof in the embodiment 1. After the protective film 23 on the main emitting face is formed, the rotating holder 173 shown in FIG. 16 is turned over by 180° rotation.

Next, a multilayered high reflection protective film 44 is formed on the opposite side of the main emitting face on which the protective film 23 is formed. The multilayered high reflection protective film 44 is composed of a first layer 44a, a second layer 44b, a third layer 44c, a fourth layer 44d, and a fifth layer 44e.

The first layer 44a made of an $Al_2O_3$ film is formed on a Si thin film 28 in the same way as the embodiment 1. Next, the second layer 44b made of a Si film is formed on the first layer 44a, and then, the third layer 44c made of an $Al_2O_3$ film is formed on the second layer 44b. Next, the fourth layer 44d made of a Si film is formed on the third layer 44c, and finally, the fifth layer 44e made of an $Al_2O_3$ film is formed on the fourth layer 44d.

FIG. 8 shows a semiconductor laser device 1 manufactured in the manufacturing process shown in FIGS. 7A to 7C. A multilayered high reflection protective film 34 is made up of a first layer 34a to a fifth layer 34e on a Si thin film 8 on the rear side of the semiconductor laser chip 1. The first layer 34a and the third layer 34c are made of an $Al_2O_3$ film corresponding to the thickness of $\lambda/4$. The second layer 34b and the fourth layer 34d are made of a Si film corresponding to the thickness of $\lambda/4$. The fifth layer 34e is made of an $Al_2O_3$ film corresponding to the thickness of $\lambda/2$. Thus, the reflectance of the multilayered high reflection protective film 34 is as high as approximately 85% or more.

Embodiment 3

In an embodiment 3, the laser bar locking apparatus 50 described in the embodiment 1 is modified for improvement thereof.

Figure 9:
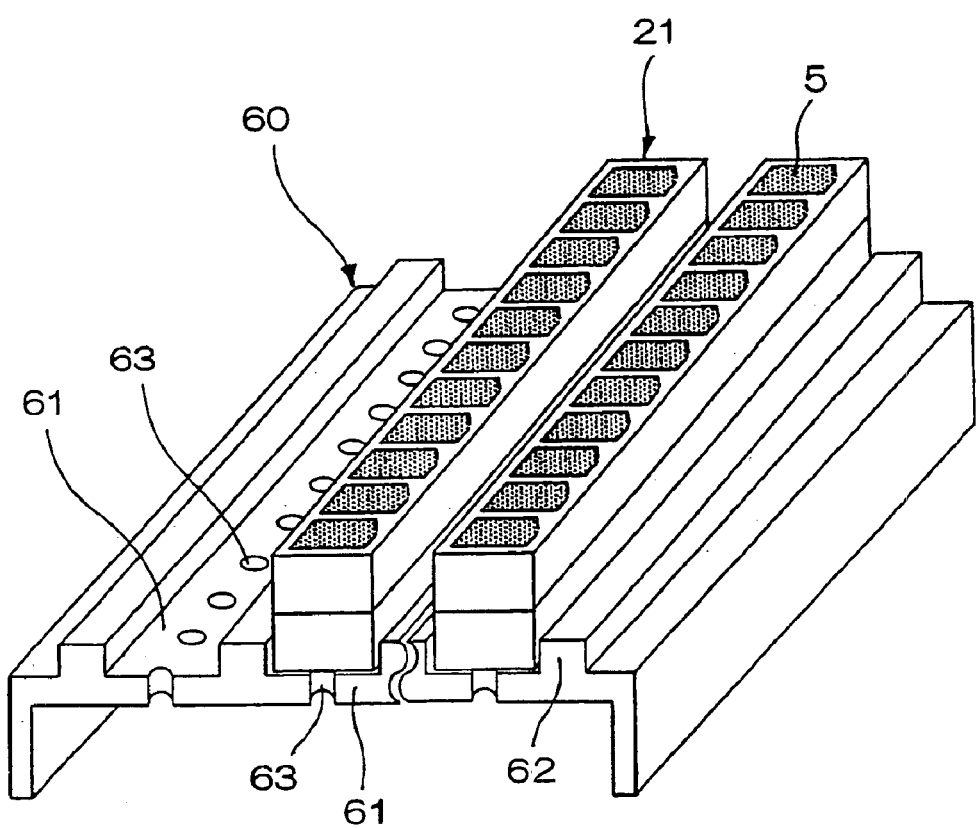
FIG. 9 is a perspective view showing a laser bar locking apparatus in an embodiment 3 of the present invention.
Figure 10:
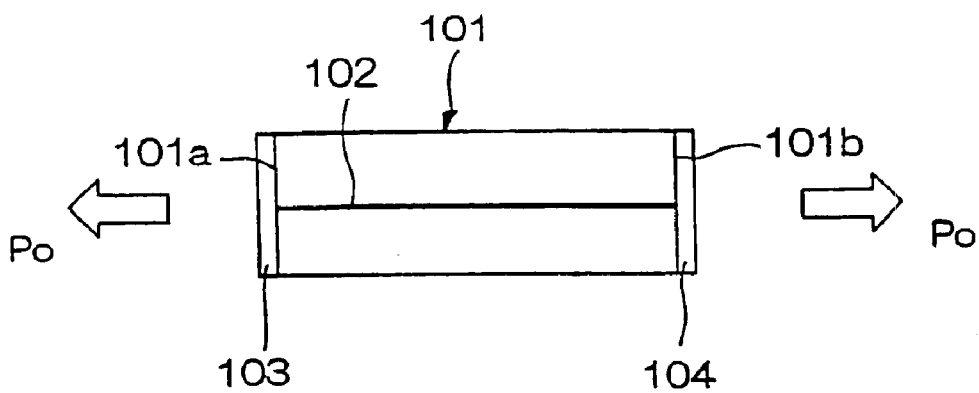
FIG. 10 is a schematic cross sectional view showing a conventional semiconductor laser device.

A laser bar locking apparatus 60 in the embodiment 3 is shown in FIG. 9 where component members identical to those shown in FIG. 1 are designated by reference numerals identical to those of FIG. 1. Description of the component members identical to those shown in FIG. 1 will be omitted or simplified.

As shown in FIG. 9, the laser bar locking apparatus 60 has a flat portion 61 provided between shielding walls 62 for setting a laser bar 21. The flat portion 61 is provided with a vacuum suction hole 63 to lock the laser bar 21 by sucking air in the vacuum suction hole 63.

For example, when a wafer having a thick GaAs layer is divided into a plurality of the laser bars 21, the laser bar 21 may be curved. However, curvature of the laser bar 21 is corrected by sucking the laser bar 21 to be locked on the flat portion 61. This correction in curvature of the laser bar 21 makes it possible to ensure formation of the Si thin films on all the end faces of the laser bars 21.

In the laser bar locking apparatus 60 of the embodiment 3, preferably, a width of the flat portions 61 has a value obtained by adding approximately 50 µm to 80 µm to a resonator length of a semiconductor laser chip.

Similarly, a width W of the flat portions 51 of the laser bar locking apparatus 50 in the embodiment 1 also has a value obtained by adding approximately 50 µm to 80 µm to a resonator length of a semiconductor laser chip.

When the width of the flat portions 51, 61 exceeds 80 µm, much more Si gets to the lower light emitting end surfaces 21$a'$, 21$b'$ shown in FIG. 3A for example. Thereby, thickness of the Si thin film 27 laminated on the lower light emitting end surfaces 21$a'$, 21$b'$ may become 20 Å or more. Accordingly, gold in the allover electrode 26 may diffuse into the active layer 22 (light emitting point) of the semiconductor laser chip 21.

In the case where the width of the flat portions 51, 61 is less than 50 µm, an interval between the shielding walls 52, 62 and the laser bar 21 becomes too small to set the laser bars 21 on the flat portions 51, 61. Therefore, the light emitting end surfaces 21$a$, 21$b$ of the laser bar 21 easily damaged.

Si used in the embodiments 1 to 3 is preferably 99.99% or more in purity.

$SiO_2$ or $TiO_2$ may be used as a protective film material, instead of $Al_2O_3$.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A laser bar locking apparatus for locking a laser bar, the laser bar having an active layer of laser chips and an allover electrode forming a lower face of the laser chips, the laser bar locking apparatus comprising:

a flat portion for mounting the laser bar thereon by contacting the allover electrode with the flat portion; and a shielding portion provided on a side of the flat portion in such a manner that the shielding portion is located lower than a position of the active layer so as to shield a lower portion of a light emitting end surface of the laser chips in the laser bar.

2. The laser bar locking apparatus as defined in claim 1, wherein the flat portion is provided with a vacuum suction hole for locking the laser bar by sucking air in the vacuum suction hole.

3. The laser bar locking apparatus as defined in claim 1, wherein a width of the flat portion is a length obtained by adding approximately 50 µm to 80 µm to a length of a resonator of the laser chip.

* * * * *